US006985261B2

(12) United States Patent
Klein et al.

(10) Patent No.: US 6,985,261 B2
(45) Date of Patent: Jan. 10, 2006

(54) METHOD AND APPARATUS FOR SEAMLESS IMAGING OF SLEEVES AS USED IN FLEXOGRAPHY

(75) Inventors: Thomas Klein, Wolfenbuettel (DE); Hans Dewitte, Brugge (BE)

(73) Assignee: Esko-Graphics A/S, Ballerup (DK)

( * ) Notice: Subject to any disclaimer, the term of this patent is extended or adjusted under 35 U.S.C. 154(b) by 907 days.

(21) Appl. No.: 09/801,063

(22) Filed: Mar. 7, 2001

(65) Prior Publication Data

US 2001/0038458 A1   Nov. 8, 2001

Related U.S. Application Data

(60) Provisional application No. 60/187,850, filed on Mar. 8, 2000.

(51) Int. Cl.
B41C 1/05   (2006.01)
B41C 1/18   (2006.01)
H04N 1/40   (2006.01)
B41J 2/44   (2006.01)
G06F 19/00   (2006.01)

(52) U.S. Cl. .................... 358/3.26; 358/3.29; 347/247; 347/248; 700/166; 700/173; 700/186

(58) Field of Classification Search ................ 382/182; 347/247, 250, 248; 430/30, 363; 358/1.9, 358/3.26, 3.29, 3.32; 219/121.68, 121.69; 700/166, 173, 186
See application file for complete search history.

(56) References Cited

U.S. PATENT DOCUMENTS

| 4,307,929 | A | * | 12/1981 | Eveleth ...................... 359/311 |
| 5,402,409 | A | * | 3/1995 | Kataoka et al. ......... 369/124.07 |
| 5,544,584 | A | * | 8/1996 | Thompson et al. ...... 101/401.1 |
| 5,654,125 | A | * | 8/1997 | Fan et al. ................... 430/306 |
| 5,790,273 | A |   | 8/1998 | Horfarter .................... 358/461 |
| 5,798,202 | A |   | 8/1998 | Cushner et al. ............ 430/306 |
| 5,868,075 | A | * | 2/1999 | Kline et al. ................. 101/467 |
| 6,120,951 | A | * | 9/2000 | Klein et al. ................... 430/30 |
| 6,558,876 | B1 | * | 5/2003 | Fan ............................. 430/306 |

FOREIGN PATENT DOCUMENTS

| EP | 0 558 008 A1 | 9/1993 |
| EP | 0613791 | 9/1994 |
| EP | 0613791 | 9/1998 |

OTHER PUBLICATIONS

Kathrin Wetzel. Technologies: "Hand Engraving" and "Embossing," Products: "Rotogravure Cyclinders." *The Wetzel Processing Group*, Grenzach-Wyhlen, Germany. Available online at http://www.wetzel.de/index.php?id=127. Accessed on Mar. 30, 2005.

* cited by examiner

*Primary Examiner*—Scott A. Rogers
(74) *Attorney, Agent, or Firm*—Dov Rosenfeld Inventek

(57) ABSTRACT

An external drum laser imagesetter providing one or more imaging beams. The drum is rotated in a fast scan direction and the one or more beams are modulated while the beams are moved in a slow scan direction. In one embodiment, the imaging beams are deflected in a slow scan direction to compensate for the spiral advance.

17 Claims, 8 Drawing Sheets

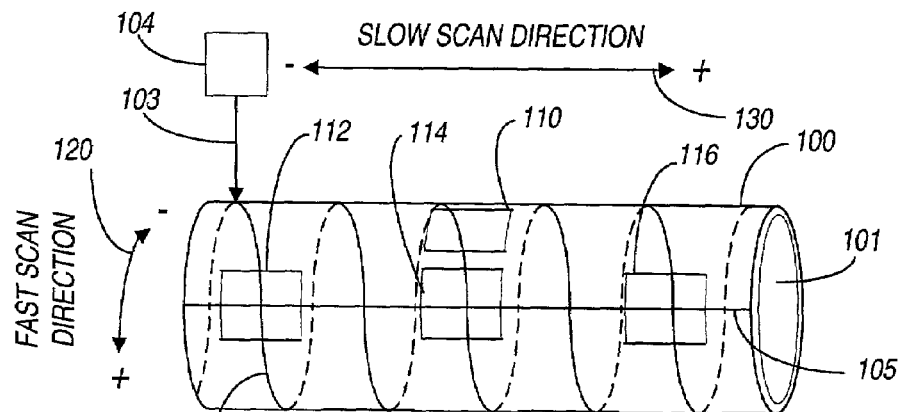
FIG. 1A (PRIOR ART)
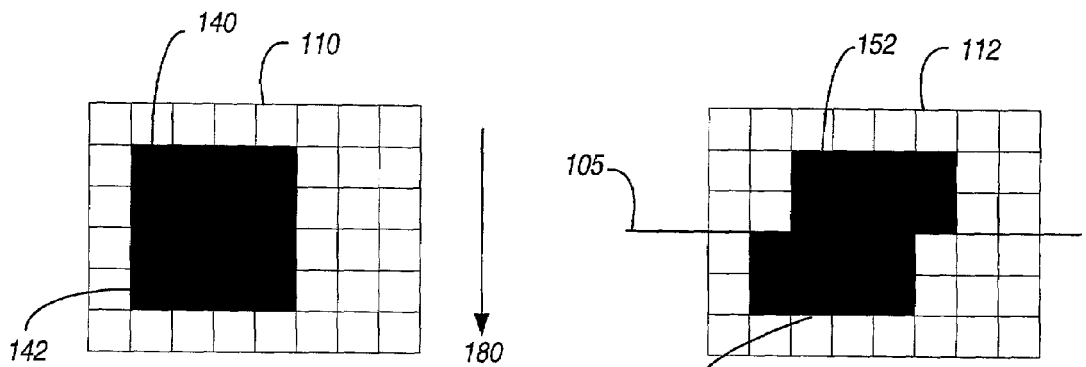
FIG. 1B (PRIOR ART)
FIG. 1C (PRIOR ART)
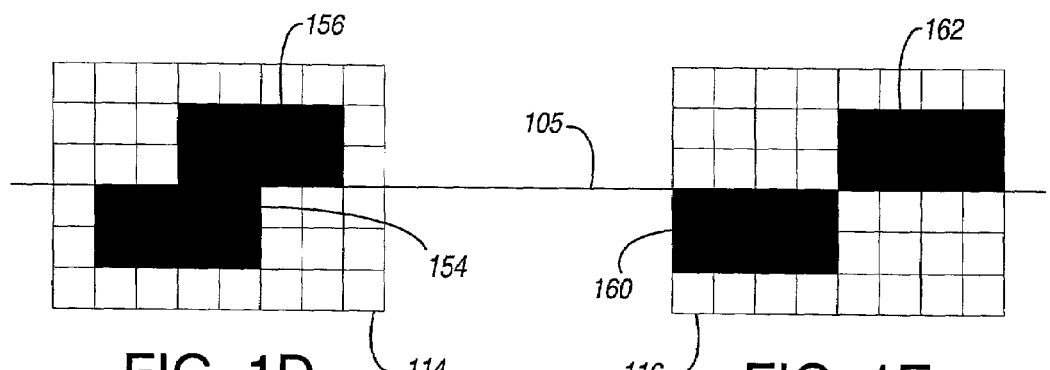
FIG. 1D (PRIOR ART)
FIG. 1E (PRIOR ART)

METHOD AND APPARATUS FOR SEAMLESS IMAGING OF SLEEVES AS USED IN FLEXOGRAPHY

RELATED U.S. APPLICATION

This application claims the benefit of Provisional Patent Application Ser. No. 60/187,850, filed Mar. 8, 2000, entitled "METHOD AND APPARATUS FOR SEAMLESS IMAGING OF SLEEVES AS USED IN FLEXOGRAPHY". Provisional Patent Application Ser. No. 60/187,850 is incorporated herein by reference.

TECHNICAL FIELD OF THE INVENTION

The invention relates seamless imaging and more specifically to an improved method and an apparatus to expose digital flexo sleeves for endless printing.

BACKGROUND

At present, flexography is one of the main printing processes. A flexo sleeve, normally rubber or photopolymer, is fabricated in such a way that the areas corresponding to zones to be inked are geometrically higher than the areas corresponding to zones not to be inked. Contacting the flexo sleeve with an inking roller, such as an anilox roller, inks the flexo sleeve. Only the geometrically higher zones of the flexo sleeve are inked, other areas are not inked. Subsequently, the inked flexo sleeve is brought in contact with a substrate and the inked parts transfer ink on to the substrate, thus producing the desired image on the substrate.

In flexography, there is demand for printing continuous designs such as wallpaper, decoration and gift wrapping paper. In general, such flexography applications use a cylindrical form, usually a printing sleeve or a cylindrical printing cylinder formed by fusing the edges of a sheet together to form a seamless, continuous element. Such continuous printing elements are well suited for mounting on conventional laser exposing engraving equipment such as the Barco Graphics Cyrel® Digital Imager (Barco Graphics, Gent, Belgium) or flexography engravers available from ZED Instruments Ltd. (Hersham, Surrey, England) or Applied Laser Engineering Ltd. (West Molesey, Surrey, England).

When continuous designs are imaged, the continuous designs must be imaged fully seamless, otherwise artifacts become visible in the final print. Artifacts at the seams are especially undesirable because such artifacts repeat with each repeat length (i.e. circumference) of the printing sleeve.

For conventional flexography, a film is wrapped around a sleeve and appropriate methods are applied to transfer the image present on that film to the flexo plate material on the sleeve (e.g., photopolymer). Using such a method, a seam is typically visible where the ends of the film overlap or come close to each other.

FIG. 1A illustrates a flexo sleeve 100 on a drum in a prior-art digital flexography apparatus using an external drum laser output scanner (imager, imagesetter). There are several laser imaging methods known to those skilled in the art to image either rubber sleeves or digital photopolymer sleeves. The flexo sleeve 100 is either mounted on a carrier like a mandrel or a carrier sleeve or cylinder 101. The carrier 101 is mounted directly into a drum laser imagesetter (the whole imagesetter is not shown) where carrier 101 functions as the rotating drum during the imaging process. In a drum laser output scanner, the fast scan direction 120 is in circumference direction (circumference of the sleeve), and the slow scan direction 130 is in axial direction. While the carrier 101 rotates in a fast scan direction shown as the negative direction in FIG. 1A, in the external drum laser imagesetter, one image track 102 is transferred in a fast scan direction shown as the positive fast scan direction. During each revolution of the carrier 101 and flexo sleeve 100 assembly the imaging head 104 slowly moves in a slow scan direction shown as the positive slow scan direction in FIG. 1A. This results in the track 102 following a spiral. In one revolution of the drum, a single first spiral image track 102 is completed. A subsequent spiral image track next to the first image track is transferred to the flexo sleeve 100 in the next revolution. The process repeats until the image is completely transferred along a spiral 102 to the flexo sleeve 100. This process is referred to as a spiral advance imaging process. The case shown in FIG. 1A is of a single laser beam output scanner. A seam is shown as 105 in FIG. 1A.

Multiple laser beam output scanners that follow spiral advance also are known. With a multi-beam system, several tracks are written during each revolution. Thus, the complete image is transferred along several spirals rather than a single spiral.

Modem laser scanning imagesetters usually use spiral advance in the slow scan direction perpendicular to the scan line ("fast-scan") direction. The spiral shape may not be a problem when imaging plates, not even for multiple beam imaging systems, because correction methods can be applied so that the result is an image that is slightly turned on the printing plate. The plate is usually cut before mounting it on a press sleeve, so the turned image can be compensated for by mounting the finally processed printing plate properly turned in the opposite direction on that press sleeve.

FIGS. 1B–1E show the pixels of one or more spiral advanced scanned lines such as line 102 through several portions, shown in an exaggerated manner as regions 110, 112, 114, and 116, respectively, of the laser scanned flexo sleeve 100 in FIG. 1A on a prior-art spiral advance scanner. The fast scan direction is the same in all FIGS. 1B–1E, and is shown as direction 180 in FIG. 1B.

FIG. 1B shows scanned pixels 140, 142 imaged at location 110 on the flexo sleeve 100 that is not near the seam 105. FIGS. 1C–1E show scanned pixels 150, 152, 154, 156, 160, 162, respectively, imaged at a seam 105.

FIG. 1C shows scanned sets of pixels 152, 154 imaged with a single laser beam on either side of the seam 105. Scanned sets of pixels 152, 154 are offset from each other in the slow scan direction 130 approximately the width of one laser beam.

FIG. 1D shows scanned sets of pixels 154, 156, imaged with two laser beams, on either side of the seam 105. Scanned sets of pixels 154, 156 are offset from each other in the slow scan direction 130 approximately the width of two laser beams.

FIG. 1E shows scanned sets of pixels 160, 162 imaged with four laser beams, on either side of the seam 105. Scanned sets of pixels 160, 162 are offset from each other in the slow scan direction 130 approximately the width of four laser beams.

As can be seen in FIGS. 1B–1E, the spiral advance process results in scanned sets of pixels 150, 152, 154, 156, 160, 162 located near or at the seam 105 being formed differently (i.e. having offsets) from scanned sets of pixels 140, 142 having the same area and located away from the seam 105. The respective offsets shown in FIGS. 1C–1E may result in visible artifacts or errors at the seam 105. The visible artifacts are typically more pronounced if more than one track is imaged at a time, for example using a multiple-beam imaging system. For $N_B$ laser beams, this offset can be $N_B$ times the distance between two image tracks in the slow scan direction 130, as can be seen in FIGS. 1C–1E.

As shown in FIG. 1C, single laser beam system using spiral advance may not result in severe artifacts. Even in this case, however, the seam 105 may become visible in some screen patterns, especially in homogeneous screens in the middle percentage area (around 50% coverage), for example, screens that use small dots, or for thin, regular vertical lines across the seam (e.g. bar-codes).

When increasing the number of laser beams (FIGS. 1D and 1E), the offset between two adjacent pixels 154, 156 and 160, 162 around the seam 105 becomes larger, and the resulting artifacts become more visible.

Current laser beam drum scanners offer only rudimentary support of seamless imaging of flexo sleeve 100. This is especially true for the emerging multiple beam imaging systems such as the CreoScitex ThermoFlex™ (CreoScitex Division of Creo Products Inc., Vancouver, BC, Canada).

FIG. 2 illustrates one prior-art method, known as "block advance" to reduce the artifacts described above in FIGS. 1C–1E. Examples of prior-art systems using block advance include the Grapholas® System from Barco Graphics/Baasel Scheel Lasergraphics, GmbH, Itzehoe, Germany. Barco Graphics, NV is the assignee of the present invention. In block advance, the advance in the slow scan direction 130 stops periodically during imaging data output. Imaging of each track starts at a specific circumference zero position 220 and stops after one revolution of the flexo sleeve 100 is completed and a complete image track 202 is written. The zero position 220 may or may not coincide with the seam 105 of the flexo sleeve 100. After the imaging stops, the imaging head 104 then moves in the slow scan direction to the next imaging position 104A while the flexo sleeve 100 revolves a complete revolution. Imaging of the next image track 204 begins at the zero position 220.

One of the main disadvantages of the block advance method described in FIG. 2 is that imaging requires approximately twice the time of imaging with spiral advance methods. The increase in imaging time is a result of the imaging being stopped for a full revolution while the imaging head 104 is moved in slow scan direction to the subsequent image track. Imaging is accomplished during one full revolution, without moving the imaging head 104, then imaging is stopped during the next full revolution so that the imaging head 104 can be advanced to the next imaging position 104A.

Digital flexography systems are very expensive. Any reduction in productivity such as reduced imaging throughput and response times, are directly correlated to reduced return on investment.

What is needed is a method to reduce the artifacts of the spiral advance method while still maintaining substantially less loss of productivity than the prior-art block advance imaging method.

SUMMARY

Disclosed herein is an apparatus for imaging a flexo sleeve mounted on a rotatable drum, the drum and sleeve combination having a seam at a seam location. The apparatus includes a laser output scanner oriented to direct one or more imaging laser beams to the surface of the flexo sleeve, each at a focal spot. The laser output scanner includes, for each laser beam, a laser beam source and a modulator to modulate the laser beam according to image data. The apparatus further includes a fast scan motion actuator to rotate the drum relative to the laser beam or beams, a slow scan motion actuator to provide relative motion between the laser beam(s) focal point(s) and the sleeve surface in a slow scan direction parallel to the axis of rotation of the drum, and a controller receiving the image data and coupled to the modulator(s), the fast scan motion actuator, and the slow scan motion actuator. The controller couples image data to the modulator(s) and compensates for artifacts at the seam while exposing the flexo sleeve at a speed substantially the same as spiral advance exposing with no seam compensation. By substantially the same speed is meant less than doubling of the time required to image the sleeve as is required by the prior-art block advance method.

In one embodiment, an external drum laser imagesetter is disclosed wherein the controller controls the imaging laser advanced in a spiral advance while the laser beam is deflected in a slow scan direction while the focus of the imaging laser beam moves in a fast scan direction.

In another embodiment, for each imaging beam, once a first image track is completed, the imaging beam is momentarily interrupted and the imaging head is advanced in the slow scan direction to a second image track, and the second image track is imaged without waiting for the laser to return to what was previously the starting position. The flexo sleeve only revolves for a fraction of a full revolution while the laser is advanced to the second image track.

In another embodiment, the image data transferred to the imagesetter is modified such that the spiral advance is compensated for either by special screens or by regularly or stochastically pixel shifts in the slow scan direction opposite to the spiral advance slow scan direction.

BRIEF DESCRIPTION OF THE DRAWINGS

The invention will now be described in more detail by means of the embodiments represented in the drawings. In the drawings:

FIG. 1A illustrates a flexo sleeve on a drum in a prior-art digital flexography apparatus using a drum laser scanner.

FIGS. 1B–1E show screening dots resulting from a spiral advanced scanned lines through several portions of a laser scanned flexo sleeve shown in FIG. 1A. FIG. 1B shows screening dots that miss the seam, and FIGS. 1C–1E show different cases of the dots located at a seam.

FIG. 6B represents the original image, FIG. 6C represents the input image and FIG. 6D represents the imaging result.

In the drawings a same reference number is attributed to a same or analogous element.

DETAILED DESCRIPTION

As will be described in more detail below, and in accordance to various embodiments, a method and apparatus is disclosed for exposing a digital flexo sleeve (e.g., a seamless plate) for endless printing including loading the flexo sleeve in an imagesetter and exposing a first image track on the flexo sleeve. In one embodiment, the imaging laser is simultaneously advanced in a spiral advance and deflected in a slow scan direction while the focus of the imaging laser moves in a fast scan direction. In a another embodiment, once the first image track is completed, the imaging laser is momentarily interrupted and the laser is block advanced to a second image track, then the second image track is imaged without waiting for a the laser focus to return to the earlier starting position in the fast scan position. The flexo sleeve only moves a small amount in the fast scan direction, e.g., only revolves for a small fraction of a full revolution while the laser is advanced to the second image track and the imaging of the second track is commenced. The image pixels are shifted to account for the pixels not imaged during that part of the fast scan movement during which imaging was stopped and the beam moved in the slow scan direction.

Figure 3A:
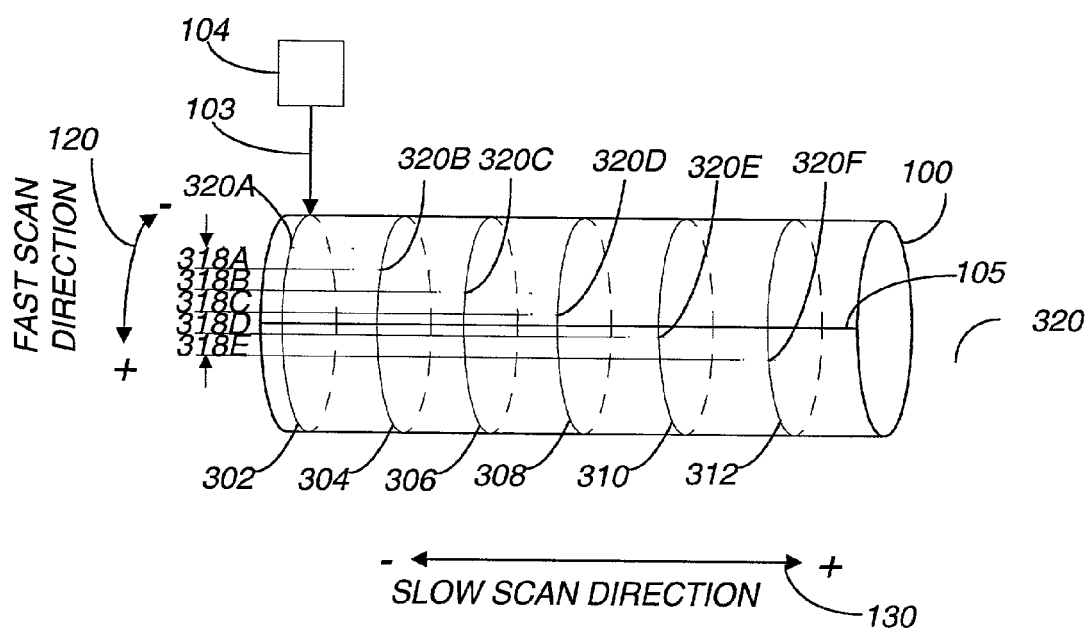
FIGS. 3A and 3B show one embodiment of an improved block imaging process with a variable starting point for each image track.
Figure 3B:
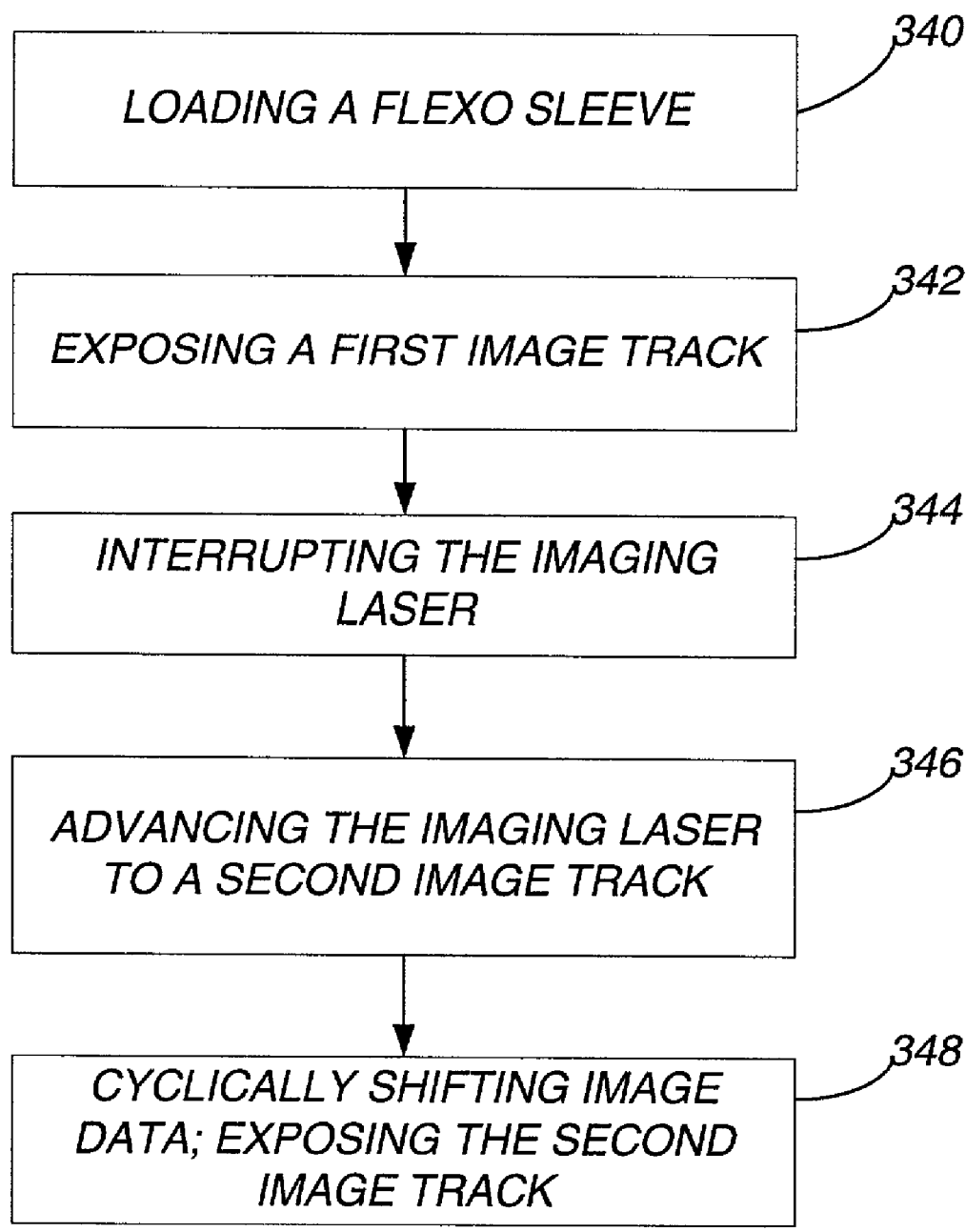

FIGS. 3A and 3B show one embodiment of an improved block imaging process with a variable starting point for each image track. The variable starting points 320A–320F are represented as the intersection of the starting line 320 and the respective image tracks 302, 304, 306, 308, 310, 312. In one embodiment of the improved block imaging process, the flexo sleeve 100 is loaded in an imagesetter in step 340. The image setter rotates the flexo sleeve 100 in the fast scan direction 120 in the direction shown as the negative fast scan direction in FIG. 3A, and the imaging head 104 is aligned to image track 302. In step 342, starting at the variable starting point 320A, the laser beam 103 writes image data to the first image track 302 during the first revolution of the flexo sleeve 100 according to imaging data modulating the laser beam using a modulator. This occurs for a complete revolution. Next, in step 344, at the end of the first revolution of the flexo sleeve 100, the laser beam 103 is momentarily interrupted, for example, by the modulator shutting off the beam. The imaging head 104 is quickly moved or advanced to align with a subsequent image track 304 in step 346. In step 348, the laser beam 103 is then restarted at the variable starting point 320B in the image track 304 to write image data. The imaging now occurs for a complete revolution. The image data of the subsequent track 304 is cyclically (i.e., circularly, periodically) shifted by a number of pixels corresponding to the difference in starting positions 320A and 320B during the writing by a controller (not shown). By cyclic shifting is meant that the data from start to end of the track is periodically shifted so that the data that would have been written at the beginning of the imaging at position 320A of the subsequent track 304 in a prior-art block advance scanner is written at the end of the revolution in this embodiment after the laser reaches that segment starting at position 320A.

The improved block imaging process continues through subsequent image tracks 306, 308, 310, 312 to complete the imaging of the flexo sleeve 100.

Only a small portion 318A of one revolution of the flexo sleeve 100 is not used for imaging the flexo sleeve 100 in image tracks 302 and 304. This may be 10% or 20% of a revolution, or even less. Note that in general, the small portion 318A may or may not be equal to other small portions 318B–318E.

Figure 5:
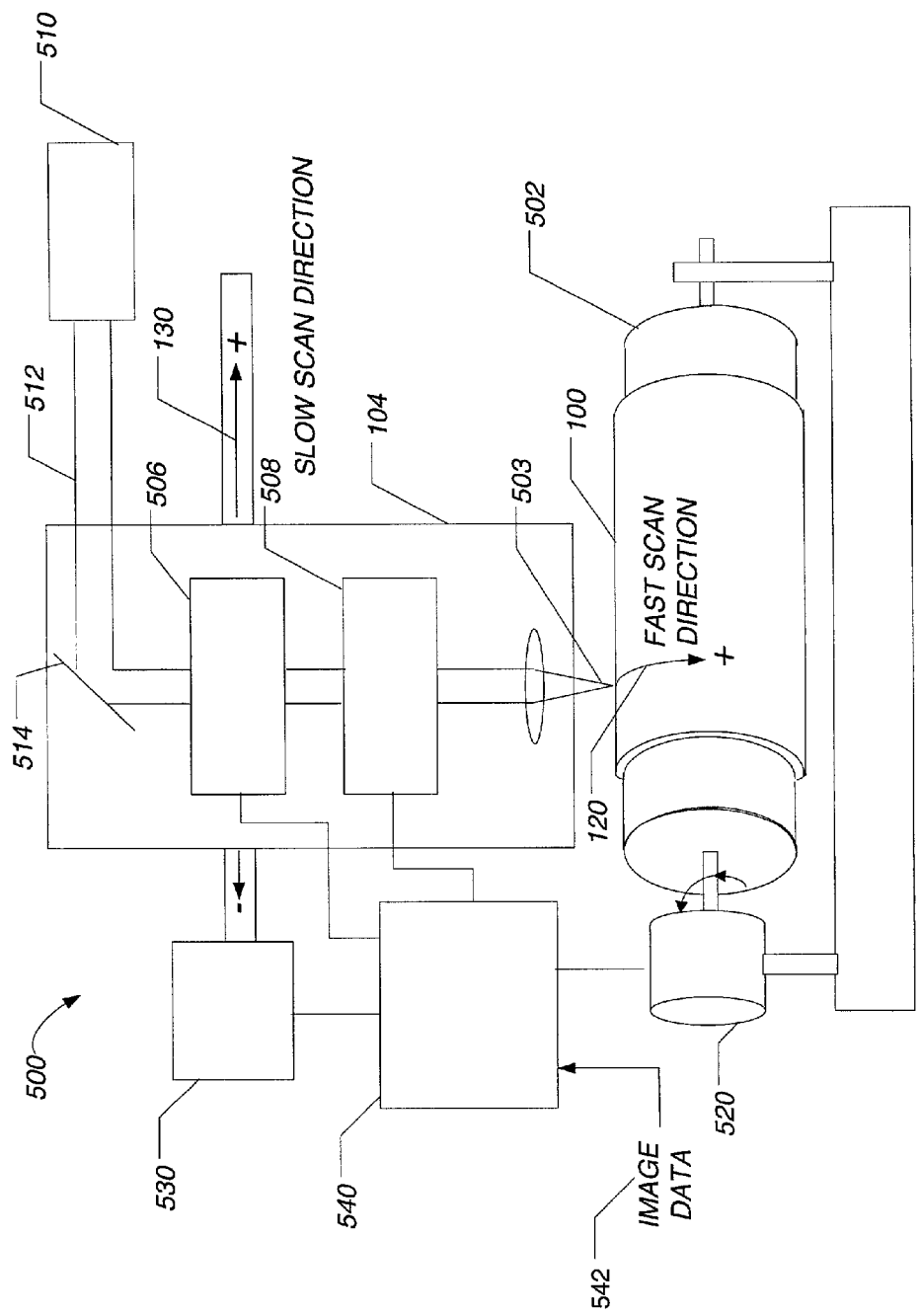
FIG. 5 illustrates one embodiment of an improved laser beam drum imagesetter embodying aspects of the invention.

FIG. 5 illustrates one embodiment of an improved laser beam external drum imagesetter 500. The improved laser beam scanner includes a laser beam source 510, an imaging head 104 to receive the laser beam, modulate the beam, and focus the modulated laser beam onto a focal spot 503 on the surface of the flexo sleeve 100. The imaging head 104 in one embodiment includes a reflector 514 to direct the laser beam from the laser beam source 510 to a deflector 506. The laser beam passes through the deflector 506 to the modulator 508 that modulates the imaging data. The imagesetter further includes a controller 540 that controls the device 500. The controller comprises a programmable microcontroller in the form of a microprocessor, and a memory that includes instructions for the microprocessor. The image data 542 is input to the controller 540, and the modulator 508 receives image data 542 from the controller 540 and modulates the laser beam 512 with the image data 542. The modulator 508 and deflector 506 work together in the imaging head to direct the modulated laser beam to the surface of the flexo sleeve 100 at the focal point 503. Note that the deflector 506 in imaging head 104 is shown preceding the modulator 508. Alternatively, the deflector 506 may occur after the modulator 508, or may be combined with the modulator 508. The flexo sleeve 100 is mounted on a drum 502. The drum is rotated by a fast scan motion actuator, for example a motor 520. The fast scan actuator 520 is controlled by the controller 540. A slow scan motion actuator, for example a motor 530, which in one embodiment, is a linear motor, moves the imaging unit 104 in a slow scan direction 130 as directed by the controller 540.

Note that FIG. 5 shows a single beam system. A multiple-beam system is similar, and includes, for each beam, a source of a laser beam, a deflector, and a modulator. A separate laser may provide each beam, for example from a laser array, or all the beams may be provided from a single laser together with a beam splitter or a beam deflector, as is known in the art.

In one embodiment of the improved block advance, the slow scan motion actuator is used to advance the imaging head 104 between one image track to another. The controller 540 provides the instructions to the slow scan motion actuator 530 to move the imaging head 104 in a slow scan direction 130 from one image track to another. The controller 540 also provides the variable starting points 318A–318E of each image track 302–312 respectively, and provides the cyclic shift of the imaging data of a complete revolution.

Another embodiment uses the deflector 506 to increase the speed of the beam focal point 503 moving rapidly in the slow scan direction from one track to a subsequent track.

In an alternate embodiment, the imaging head 104 can include multiple imaging laser beams where each laser beam images a different image track simultaneously. For example, if image track 302 consists of N pixels, data output for imaging does not necessarily start at pixel number 1, but at pixel number $N_0$, where $1 \leq N_0 \leq N$. $N_0$ changes from a first image track to a second image track according to the time required to advance the imaging head 104 to the second image track. This is a much smaller time than the time needed for a full rotation of the drum 502. The use of block advance with variable imaging start position thus improves productivity by minimizing the duration of the wait cycles.

Some flexo sleeves show thermal history effects, and this may cause banding. If the imaging process results in visible thermal history effects on the flexo sleeve 100, then, in addition to the shift to account for the slow scan track-to-track motion, the variable starting points can be controlled to compensate for the thermal history effects that become visible, such as banding. One embodiment varies the variable starting points stochastically. Another includes recording the effect and adding the shifted starting points.

Note that the improved block advance system still slows down imaging compared to 100% spiral advance. The slow-down depends on the speed of slow scan advance from track to track, including the time required to start and stop the slow scan direction motion actuator. In some embodiments, the motion actuator may always be on, and the imaging head be engaged or disengaged from the motion actuator to effect the track-to-track motion.

An alternate embodiment compensates for the spiral advance by deflecting the beam in the slow scan direction during imaging.

Figure 2:
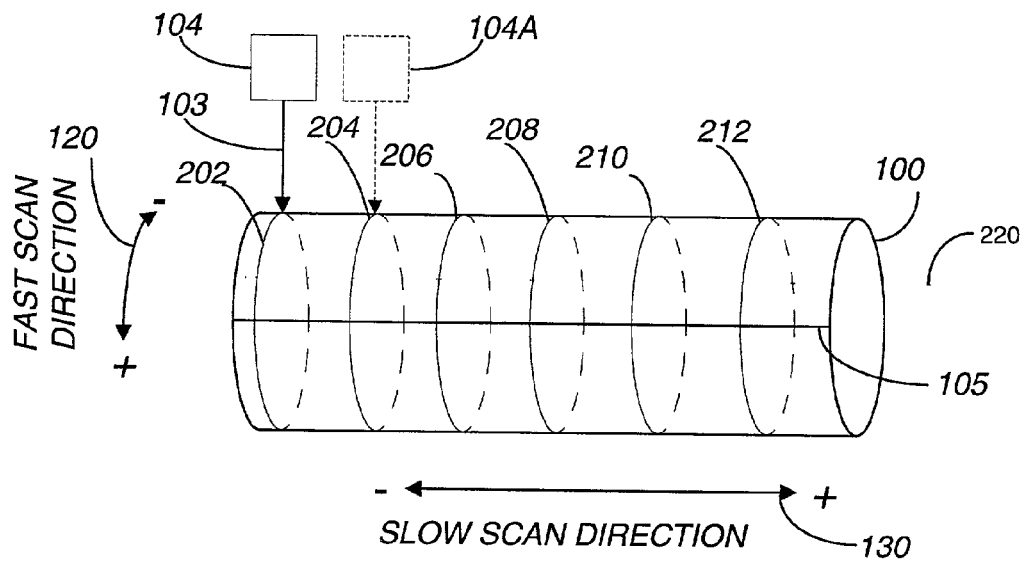
FIG. 2 illustrates a prior-art block advance method to reduce imaging artifacts.
Figure 4A:
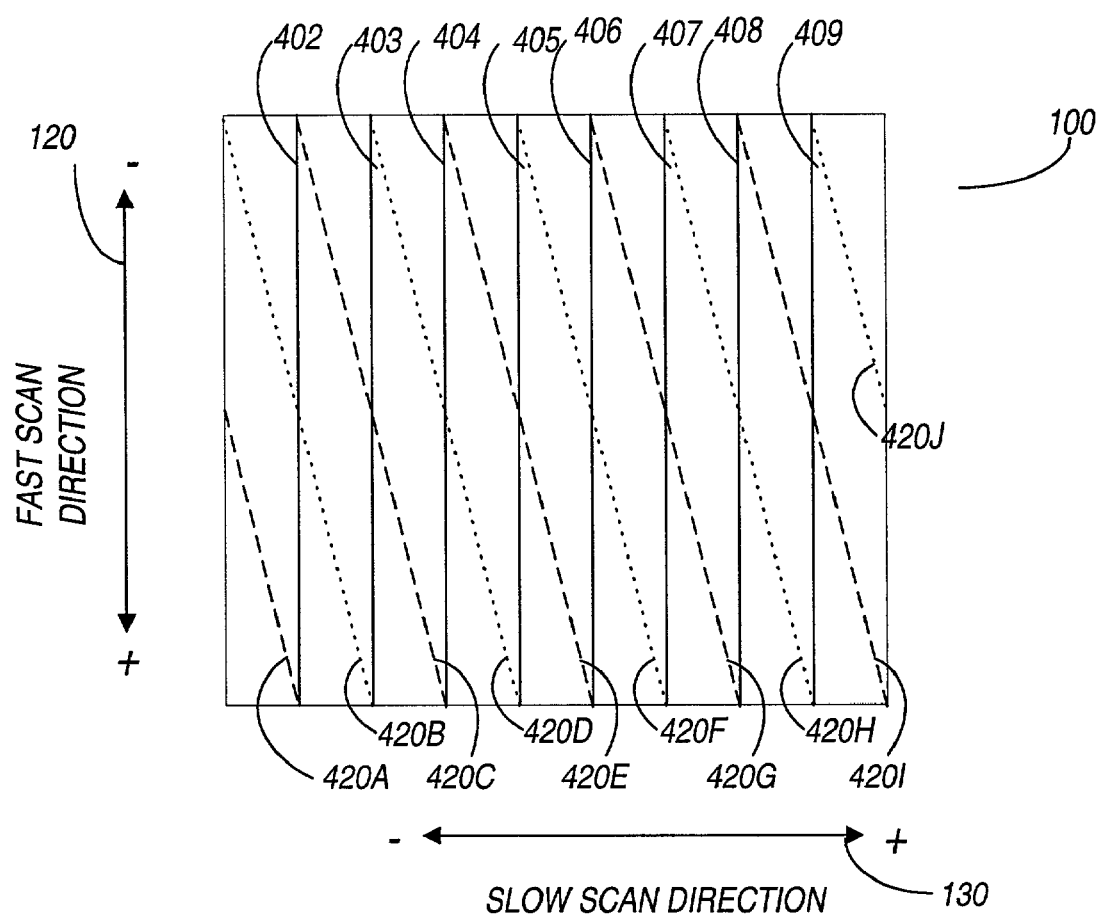
FIG. 4A illustrates a flattened flexo sleeve of one embodiment of an improved spiral advance method.
Figure 4B:
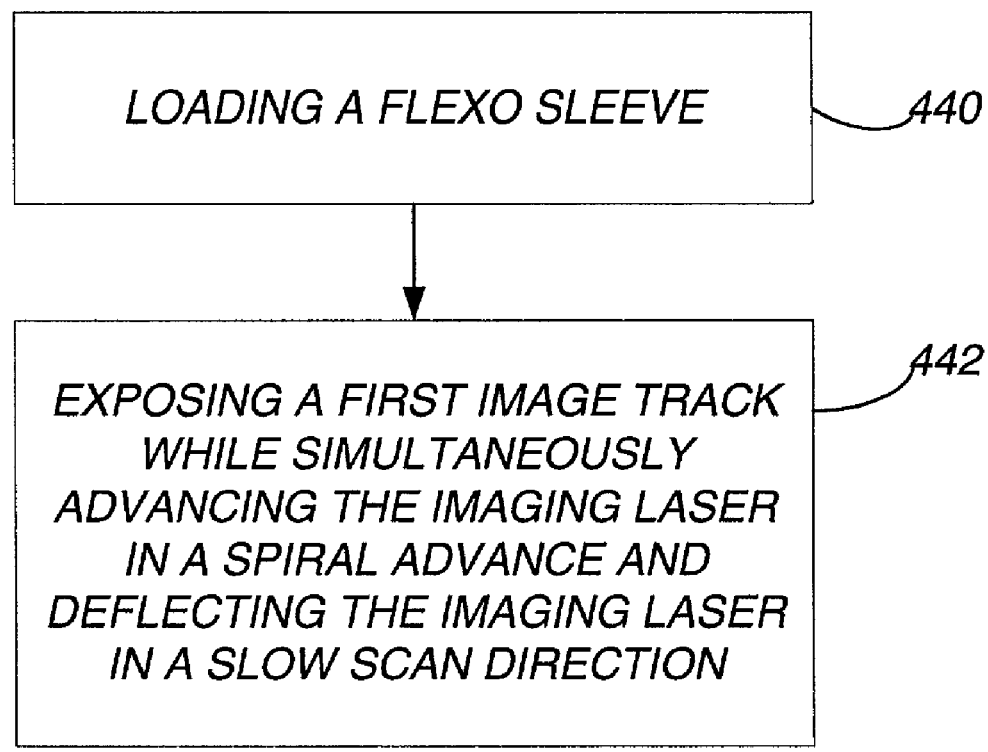
FIG. 4B shows one method embodiment of the improved spiral advance invention.

FIGS. 4A and 4B illustrate a flexo sleeve 100 of one embodiment of an improved spiral advance apparatus and method that includes beam deflection. In the improved spiral advance method the imaging head 104 (not shown) moves as in the imagesetter 500 of FIG. 5A. FIG. 4A shows a dual beam system that, with no compensation, writes two spiral tracks at a time. With a prior art system (e.g., a two-beam version of FIG. 1A), the spiral paths 420A, 420C, 420E, 420G, and 420I correspond to one flattened spiral image track 102 of one of the beams of the two-beam system, and the spiral paths 420B, 420D, 420F, 420H, and 420J correspond to the other the flattened spiral image track of the two beam system. In an improved imagesetter, each of the spiral portions 420A–420J generated by the laser beam are deflected in the slow scan direction during fast scan imaging to form image tracks 402–409. The resulting image tracks 402–409 are somewhat similar to the image tracks 202, 204, 206, 208, 210, 212 shown the block advance method of FIG. 2 above.

Referring again to the imagesetter of FIG. 5, in one embodiment, the deflection is carried out by deflector 506 under control of the controller 540. In one embodiment, deflector 506 is an acousto-optic deflector. In another embodiment, the deflector includes a piezo-electric mirror. If an acousto-optical device is used, it may be the same as the one used for modulating the laser beam according to the image data to be written, or it may be a different one. One embodiment of the method is described in FIG. 4B. In step 440, a flexo sleeve 100 is loaded in an imagesetter. In step 442, at the start of each rotation relative to the imaging head, for example at the start of the forming of path 420C, the modulated laser beam 503 is gradually deflected in a less positive slow scan direction to produce image track 402, with the positive and negative directions as defined in FIG. 4A and 5. As the beam moves in the fast scan direction, the imaging heads are moving in the positive slow scan direction, so more and more deflection is used to maintain the track as shown in track 102. After the spiral image head path 420C reaches its earlier starting point, called the zero position, which is the intersection of track 420C and image track 402, the modulated laser beam 503 is deflected to the intersection of track 404 and what would have been spiral track segment 420E. The imaging of track 404 now proceeds.

In an alternative embodiment with multiple imaging laser beams, the multiple laser beams may be deflected to image different portions of a single image track or may be deflected to multiple image tracks.

The deflection of the beam on the slow scan direction to compensate for the spiral advance and the track to track deflection is carried out under control of the controller 540. When acousto-optical modulator (AOM) is used for the deflector 506, an RF amplifier drives the AOM. In one embodiment, the driving frequency of the AOM deflector 506 is adapted by the controller 540 to achieve a deflection of the laser beam, and therefore of the focus spot position, such that the advance in slow scan direction 130 during one image track, i.e., during one revolution of the drum 502, is precisely compensated.

One embodiment for deflecting the focus spot of the imaging laser beam using an AOM includes adding a constant frequency chirp, such as a linear frequency raise between zero at the start of a track and a maximum value $\Delta f$ at the end of the track, to the basic frequency $f_0$ of the RF amplifier driving the AOM. The chirp is reset each time a revolution of the drum 502 is completed. The frequency driving the AOM is described by:

$$f(t)=f_0+\Delta f*t/T, \ t=0, \ldots, T,$$

where T is the time needed for one revolution of the drum 502.

The driving frequency $f_0$ is modulated according to the image data for the particular image track. When imaging the first pixel in each track, time t is set back to zero.

In one embodiment shown in FIG. 5, the imaging laser beam is deflected in a first AOM shown as deflector 506 in FIG. 5, and modulated in a second AOM that is part of modulator 508 in FIG. 5. The first and second AOMs can be in any order. Alternatively, the modulation and deflection can be carried out by a single AOM and the driving frequency $f_0$ of the same RF signal can be modulated, so that only one AOM produces both image transfer and deflection.

It may be that the deflection angle is not sufficiently linear to the driving frequency. In an improved apparatus, an interpolation table us used to increase the accuracy. A specific driving frequency is assigned to each specific deflection angle value in the table, and a look up used to determine the driving frequency for the AOM deflector.

If multiple beams are generated using an AOM by applying a set of different frequencies (e.g., the Cyrel™ Digital Imager (CDI) TwinBeam™ system manufactured by Barco Graphics NV, of Belgium, the assignee of the present invention), the deviation frequency as described above is added to all individual frequencies to deviate all beams by the same offset in negative or positive slow scan direction 130 as required. This deflection is preferably done by taking the characteristics AOM into account, especially the characteristic of the dependency of the deflection angle from the driving frequency. Thereby a correction table can be used to correct non-linear dependencies of the deflection angle from the driving frequency.

Acousto-optic deflection usually is fast enough to switch back to normal imaging position between the last pixel 150 of a first image track such as image track 402 and the first pixel 152 of a subsequent image track 406. The described method and apparatus enables seamless imaging with the full speed of non-seamless single beam or multiple beam imaging.

As rotation speeds increase, it may not be possible to achieve the track-to-track deflection fast enough. In an improved embodiment, when the deflection from track to track takes more than the time to move one pixel length in the fast scan direction, the starting points for each of the image track 402–410 is varied as described in shown in FIG. 3A. The imaging commences as soon as the deflection is complete. The controller keeps track of where the beam is in the fast scan direction. The pixels for the track are then cyclically shifted by the starting position shift in a method analogous to the improved block advance method described above.

Figure 7:
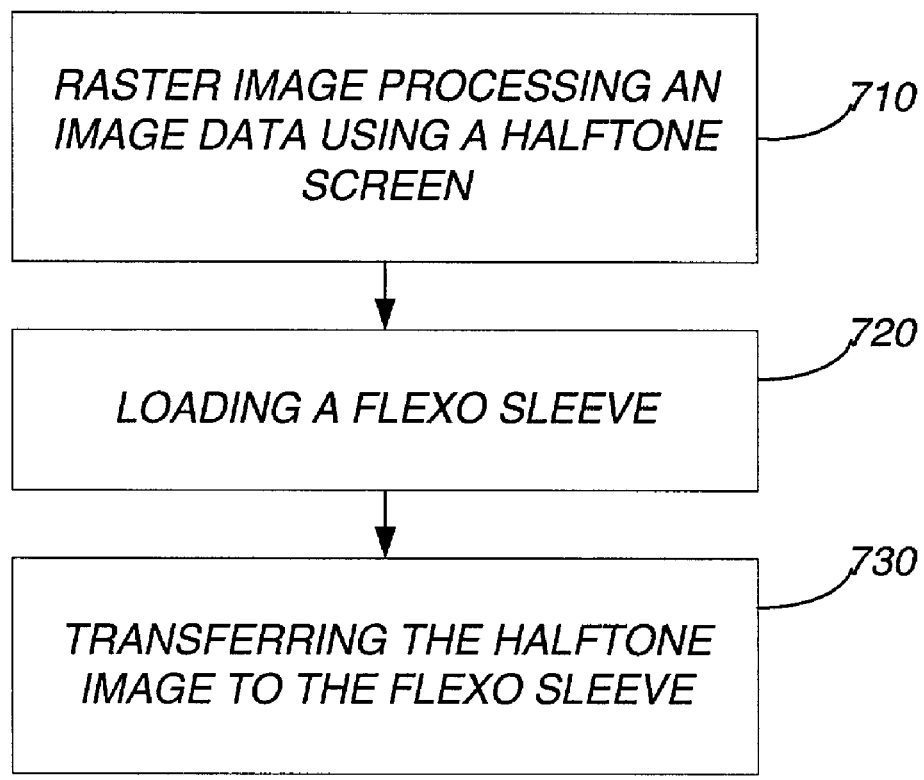
FIG. 7 shows a halftone screening process of one embodiment.

FIG. 7 illustrates another embodiment using special halftone screens. First, in step 710 the image data is raster image processed (RIPped), before exposure, using a halftone screen which has been adapted for imaging on cylinders that may have a seam in a manner that renders the seam substantially invisible. Next, in step 720, the flexo sleeve 100 is loaded in an imagesetter. Then in a step 730, the halftone screened image data is transferred to the flexo sleeve 100. One advantage of using special halftone screens is that a prior-art imaging head that does not include a deflector 506 or block advance controls can be used to enable seamless imaging. Using special halftone screens saves the cost of modifying the optics at the typically lower expense of modifying the RIP software.

Figure 6A:
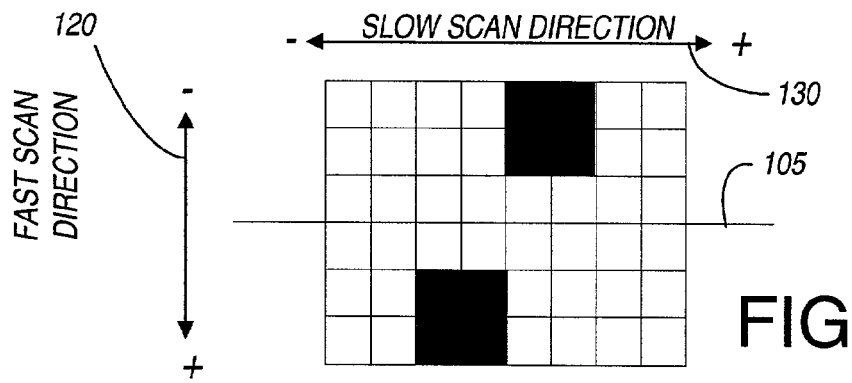
FIG. 6A represents a special screen avoiding direct pixel placement at the seam imaged with two-beam spiral advance, in accordance with one embodiment.

Special halftone screens can be used to diminish the visibility of the artifacts at the seam 105, even if no compensation methods, such as described above in FIGS. 3A–4A, are used. The halftone screens are special halftone screens designed to avoid positioning any dots (e.g., pixels) directly at the seam 105. Such a screen is shown in FIG. 6A. Because no pixels are located on the seam 105, any artifacts that may exist are much less visible to the human eye because there is no direct contact between correctly positioned pixels at the start of the image track, and wrongly positioned pixels at the end of the image track. It should be noted that this embodiment may not work perfectly for all patterns, such as for 50% halftone screens, or fine vertical lines, because some patterns cannot be modified to move all pixels away from the seam 105.

In yet another embodiment, the halftone screens for the image data have a shift introduced in the dot center positions in the slow scan direction while proceeding from the start to the end of the fast scan, e.g., during one complete revolution in a drum output scanner. The shift in one embodiment is regular, and in another embodiment is random, i.e., stochastic. The shift steps are such that, together, they compensate exactly for the gap in the zero position in the case that standard spiral advance is used. This provides for normal spiral advance to be used, for example with multiple beam exposure units, to provide seamless imaging substantially without artifacts.

To achieve this, a number of pixels is either regularly or stochastically subtracted from the pixel positions within each track. That is, the image is slanted in negative advance direction by the number of advance pixels per revolution of the drum, as shown in FIGS. 6B–6D.

Figure 6B:
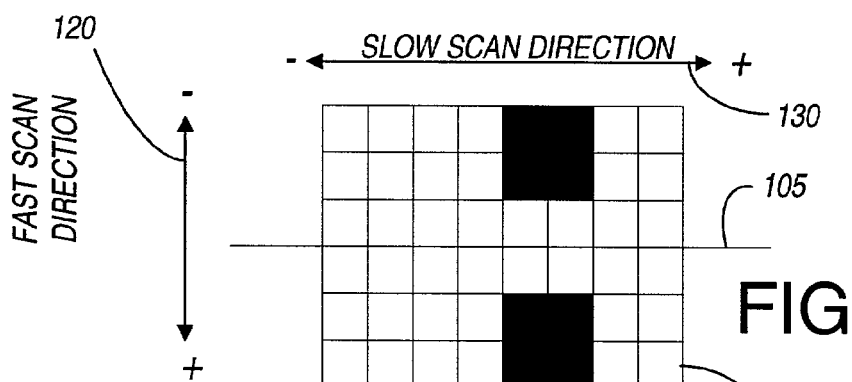
FIGS. 6B–6D show modified pixels of one embodiment, and in particular schematically explain the use of a special screen for position compensation of pixels in case of two-beams spiral advance, in one embodiment of the invention.
Figure 6C:
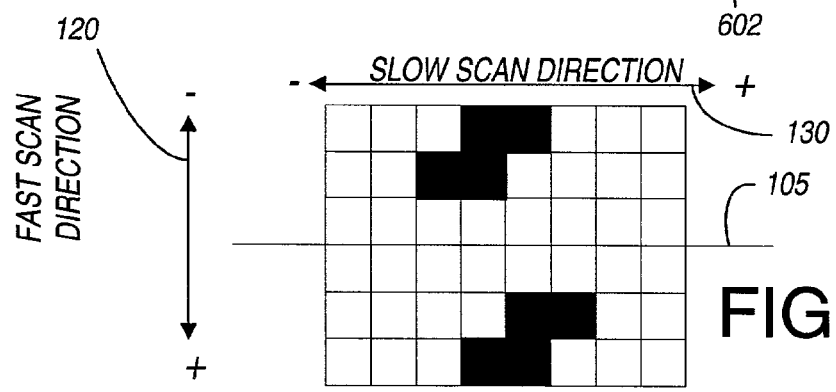
Figure 6D:
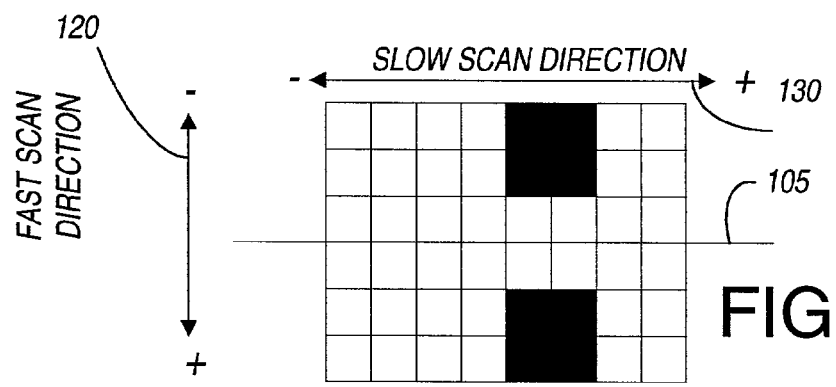

Consider for example a seamless halftone screen 602 as shown in FIG. 6B, and suppose the halftone screen 602 is imaged in a spiral advance system. A visible seam may still be generated because the pixels before and after the zero position are shifted against each other by the advance, as explained earlier with the aid of FIGS. 1B–1E. To compensate for this, pixel displacements are introduced in the halftone screen as the data is imaged in the fast scan direction 120, and such a screen is shown in FIG. 6C. In one embodiment, the displacements are introduced stochastically, and in another embodiment, displacements are introduced regularly. When the corrected version of the halftone screen as represented in FIG. 6C is imaged with a spiral advance of 2 pixels (two-beams spiral advance), the result shown in FIG. 6D is obtained, which is what ideally should have been obtained in view of the original screen shape of FIG. 6B.

In one embodiment, the pixel displacements are introduced in the RIP. In another embodiment, the pixel displacements are applied on-the-fly in the imagesetting process, for example by the controller in the imagesetter.

Note that embodiments of the invention has been described above for an external drum scanner. Other configurations also are possible. Furthermore, while motors have been used in the above embodiments as examples of motion actuators in the fast and slow scan directions, any other means for providing relative motion in the fast and slow scan directions may be used.

There have been described herein what are believed to be the preferred embodiments (in both apparatus and method form) of the invention. Those skilled in the art will recognize that other and further modifications may be made thereto without departing from the spirit of the invention, and it is intended to claim all such changes and modifications as fall within the scope of the invention.

What is claimed is:

1. An apparatus for imaging a flexo sleeve, the apparatus comprising:
   a flexo sleeve mounted on a rotatable drum, the drum and sleeve combination having a seam at a seam location;
   a laser output scanner oriented to direct one or more imaging laser beams to the surface of the flexo sleeve at one or more corresponding focal spots, the laser output scanner including for each laser beam:
   a laser beam source, and
   a modulator to modulate the laser beam of the laser beam source according to image data;
   a fast scan motion actuator to rotate the drum relative to the one or more laser beams;
   a slow scan motion actuator to provide relative motion between the focal points of the one or more laser beams and the sleeve surface in a slow scan direction parallel to the axis of rotation of the drum; and
   a controller receiving the image data and coupled to each modulator, the fast scan motion actuator, and the slow scan motion actuator,
   wherein the controller couples image data to each modulator and compensates for artifacts at the seam while exposing the flexo sleeve at a speed substantially the same as conventional spiral advance imaging with no seam compensation, wherein the image data is screened using a screen that diminishes the visibility of artifacts at the seam location, and wherein the screen includes pixel displacements in the slow scan direction, the pixel displacement dependent on the distance in the fast scan direction from a starting position, such that imaging using the pixel-displaced screen with spiral advance substantially corrects seam artifacts.

2. An apparatus as recited in claim 1, wherein the screen displacement is precalculated during raster image processing to prepare the image data.

3. An apparatus as recited in claim 1, wherein the image data is screened, and wherein the controller causes a deflector coupled to the controller to perform the screen displacement on the fly.

4. An apparatus for imaging a flexo sleeve, the apparatus comprising:
   a flexo sleeve mounted on a rotatable drum, the drum and sleeve combination having a seam at a seam location;
   a laser output scanner oriented to direct one or more imaging laser beams to the surface of the flexo sleeve at one or more corresponding focal spots, the laser output scanner including for each laser beam:
   a laser beam source, and a modulator to modulate the laser beam of the laser beam source according to image data;

a fast scan motion actuator to rotate the drum relative to the one or more laser beams;

a slow scan motion actuator to provide relative motion between the focal points of the one or more laser beams and the sleeve surface in a slow scan direction parallel to the axis of rotation of the drum; and a controller receiving the image data and coupled to each modulator, the fast scan motion actuator, and the slow scan motion actuator, wherein the controller couples image data to each modulator and compensates for artifacts at the seam while exposing the flexo sleeve at a speed substantially the same as conventional spiral advance imaging with no seam compensation, wherein the laser output scanner includes for each beam a deflector for deflecting the laser beam, the deflector coupled to the controller, and wherein the controller causes each deflector to deflect the focus spot of its beam in the slow scan direction while the focus spot moves in fast scan direction, and wherein each deflector deflects its focus spot at a speed substantially equal to the speed of advance in the slow scan direction, and in a direction opposite the motion in the slow scan direction.

5. An apparatus as recited in claim 4, wherein the controller further causes the deflectors to deflect the laser beams to the next set of laser beam positions at the end of each revolution of the drum in the fast scan direction, and wherein the controller then commences imaging at the next set of laser beam positions.

6. An apparatus as recited in claim 5, wherein the deflection of the beams from one set of beam positions to the next set of beam positions at the end of each revolution to write a next set of tracks occurs while the drum rotates at least one pixel length in the fast scan direction, wherein the controller further cyclically shifts the imaging data for the next set of tracks by an amount corresponding to the drum rotation that occurs during the deflection in the slow scan direction, such that the imaging data is correctly written onto the next set of tracks.

7. An apparatus for imaging a flexo sleeve, the apparatus comprising:

a flexo sleeve mounted on a rotatable drum, the drum and sleeve combination having a seam at a seam location;

a laser output scanner oriented to direct one or more imaging laser beams to the surface of the flexo sleeve at one or more corresponding focal spots, the laser output scanner including for each laser beam:

a laser beam source, and a modulator to modulate the laser beam of the laser beam source according to image data;

a fast scan motion actuator to rotate the drum relative to the one or more laser beams;

a slow scan motion actuator to provide relative motion between the focal points of the one or more laser beams and the sleeve surface in a slow scan direction parallel to the axis of rotation of the drum; and a controller receiving the image data and coupled to each modulator, the fast scan motion actuator, and the slow scan motion actuator, wherein the controller couples image data to each modulator and compensates for artifacts at the seam while exposing the flexo sleeve at a speed substantially the same as conventional spiral advance imaging with no seam compensation, wherein the laser output scanner includes for each beam a deflector for deflecting the laser beam, the deflector coupled to the controller, and wherein the controller causes each deflector to deflect the focus spot of its beam in the slow scan direction while the focus spot moves in fast scan direction, wherein the image data is screened using a screen, and wherein the controller causes each of the deflectors to displace the pixels of the screen in the slow scan direction by an amount dependent on the fast scan distance such that imaging with a spiral advance substantially corrects the screens for spiral advance to diminish the visibility of artifacts at the seam.

8. An apparatus as recited in claim 7, wherein the screen is a screen designed to avoid placing dots at the seam.

9. An apparatus for imaging a flexo sleeve, the apparatus comprising:

a flexo sleeve mounted on a rotatable drum, the drum and sleeve combination having a seam at a seam location;

a laser output scanner oriented to direct one or more imaging laser beams to the surface of the flexo sleeve at one or more corresponding focal spots, the laser output scanner including for each laser beam:

a laser beam source, and a modulator to modulate the laser beam of the laser beam source according to image data;

a fast scan motion actuator to rotate the drum relative to the one or more laser beams;

a slow scan motion actuator to provide relative motion between the focal points of the one or more laser beams and the sleeve surface in a slow scan direction parallel to the axis of rotation of the drum; and a controller receiving the image data and coupled to each modulator, the fast scan motion actuator, and the slow scan motion actuator, wherein the controller couples image data to each modulator and compensates for artifacts at the seam while exposing the flexo sleeve at a speed substantially the same as conventional spiral advance imaging with no seam compensation, and wherein the controller controls a complete rotation of the drum while suppressing motion in the slow scan direction, the rotation causing the one or more beams to write a first set of one or more tracks according to the image data at a set of track locations, wherein the controller further causes the beams to advance in the slow scan direction to the next set of track positions while imaging is suppressed, the controller further commencing imaging at said next set of tracks when the advance in the slow track direction is complete, the controller further cyclically shifting the imaging data for the next set of tracks by an amount corresponding to the drum rotation that occurs during the advance in the slow scan direction, such that the imaging data is correctly written onto the next set of tracks.

10. An apparatus for imaging a flexo sleeve comprising:

a flexo sleeve mounted on a rotatable drum, the drum and sleeve combination having a seam at a seam location;

an laser output scanner oriented to direct one or more imaging laser beams to the surface of the flexo sleeve at one or more corresponding focal spots, the laser output scanner including, for each beam:

a laser beam source, a deflector to deflect the beam, and a modulator to modulate the laser beam according to image data;

a fast scan motion actuator to rotate the drum relative to each laser beam;

a slow scan motion actuator to provide relative motion between each laser beam focal point and the sleeve surface in a slow scan direction parallel to the axis of rotation of the drum; and a controller receiving the image data and coupled to each modulator, the fast scan motion actuator, each deflector, and the slow scan motion actuator, wherein the controller couples image data to the modulator and causes each of the deflectors to deflect its focus spot in the slow scan direction while the focus spot moves in fast scan direction, and wherein each deflector deflects its focus spot at a speed substantially equal to the speed of advance in the slow scan direction, and in a direction opposite the motion in the slow scan direction to compensate for the spiral advance of relative rotation by the fast scan motion actuator combined with the relative motion caused by the slow scan motion actuator in the slow scan direction.

11. A method of seamlessly exposing a digital flexo sleeve, comprising the steps of:

loading a digital flexo sleeve having a sleeve surface in a laser imagesetter device;

exposing one or more image tracks on the digital flexo sleeve with one or more laser beams moving in a fast scan direction and modulated according to image data;

advancing the laser beams in a slow scan direction; and compensating for any spiral advance such that artifacts at any seam locations at the sleeve are substantially diminished, wherein the exposing and advancing the laser beams in a slow scan direction occur simultaneously, and wherein the compensating includes simultaneously deflecting the laser beams in the slow scan direction in a direction opposite the slow scan advance direction by an amount dependent on the distance in the fast scan direction from a starting position, while the laser beams move in the fast scan direction on the sleeve surface, such that the spiral advance is compensated.

12. A method of seamlessly exposing a digital flexo sleeve, comprising the steps of:

loading a digital flexo sleeve having a sleeve surface in a laser imagesetter device;

exposing one or more image tracks on the digital flexo sleeve with one or more laser beams moving in a fast scan direction and modulated according to image data;

advancing the laser beams in a slow scan direction; and compensating for any spiral advance such that artifacts at any seam locations at the sleeve are substantially diminished, wherein the image data is screened using a screen, wherein the exposing and advancing the laser beams in a slow scan direction occur simultaneously, and wherein the compensating includes shifting pixel data in the screened image data in the slow scan direction opposite to the slow scan advance direction to compensate for the spiral advance.

13. A method as recited in claim 12, wherein the shifting is stochastic.

14. A method as recited in claim 12, wherein the shifting pixel data for a plurality of pixels includes:

RIPping an image using a plurality of specially designed halftone screens, wherein each one of the plurality of the halftone screens use a stochastic pixel shift in a negative slow scan direction.

15. A method of seamlessly exposing a digital flexo sleeve, comprising the steps of:

loading a digital flexo sleeve having a sleeve surface in a laser imagesetter device;

exposing one or more image tracks on the digital flexo sleeve with one or more laser beams moving in a fast scan direction and modulated according to image data;

advancing the laser beams in a slow scan direction; and compensating for any spiral advance such that artifacts at any seam locations at the sleeve are substantially diminished, wherein the fast scan motion is rotation of the sleeve relative to the one or more laser beams, and wherein compensation includes:

suppressing motion in the slow scan direction during exposing, the exposing including rotation in the fast scan direction causing the one or more tracks to be written on the sleeve according to the image data in a first set of track positions, advancing the one or more beams to advance in the slow scan direction to the start of a next set of tracks at a next set of track positions while suppressing imaging, commencing imaging at the start of the next set of tracks when the advance in the slow scan direction is complete, cyclically shifting the imaging data for the next set of tracks by an amount corresponding to the sleeve rotation that occurs during the advance in the slow scan direction, such that the imaging data is correctly written onto the next set of tracks.

16. A method of seamlessly exposing a digital flexo sleeve, the method comprising the steps of:

loading a digital flexo sleeve in a laser imagesetter device;

exposing a first image track on the digital flexo sleeve with a laser beam modulated according to image data;

interrupting the laser beam;

advancing the laser beam to a second image track in a block advance in a slow scan direction, wherein the block advance requires less than a full revolution of the flexo sleeve; and starting an exposure of the second image track immediately upon completion of the block advance, wherein starting the exposure of the second image track includes cyclically shifting the second image track image data so that data of the second image track is written at a correct position on the digital flexo sleeve.

17. A method of seamlessly exposing a digital flexo sleeve, the method comprising the steps of:

loading a digital flexo sleeve in a laser imagesetter device;

exposing a first image track on the digital flexo sleeve with a laser beam modulated according to image data;

interrupting the laser beam:

advancing the laser beam to a second image track in a block advance in a slow scan direction, wherein the block advance requires less than a full revolution of the flexo sleeve; and starting an exposure of the second image track immediately upon completion of the block advance, wherein multiple image tracks are imaged simultaneously.

* * * * *